(12) United States Patent
Guthrie

(10) Patent No.: US 6,420,873 B1
(45) Date of Patent: Jul. 16, 2002

(54) MRI NOISE DETECTOR AND SUPPRESSOR

(75) Inventor: Warren Guthrie, West Olive, MI (US)

(73) Assignee: Netcom, Inc., Wheeling, IL (US)

( * ) Notice: Subject to any disclaimer, the term of this patent is extended or adjusted under 35 U.S.C. 154(b) by 0 days.

(21) Appl. No.: 09/784,259

(22) Filed: Feb. 15, 2001

(51) Int. Cl.[7] ................................................ G01V 3/00
(52) U.S. Cl. ...................................... 324/322; 324/318
(58) Field of Search ................................ 324/322, 318, 324/300, 306, 307, 309, 312, 314

(56) References Cited

U.S. PATENT DOCUMENTS

| | | | | |
|---|---|---|---|---|
| 4,992,736 A | * | 2/1991 | Stormont et al. | 324/309 |
| 5,245,288 A | * | 9/1993 | Leussler | 324/318 |
| 5,525,906 A | | 6/1996 | Crawford et al. | 324/322 |
| 6,233,254 B1 | * | 5/2001 | Myers | 370/480 |

OTHER PUBLICATIONS

Exhibit A comprises a commonly assigned, co–pending application entitled "Noise Detector and Suppressor for Magnetic Resonance Imaging Eguipment" that has not yet been assigned a serial number. The subject matter of this application may have been on sale prior to the present invention, and my have been on–sale more than one year prior to the present invention's filing date.

* cited by examiner

*Primary Examiner*—Louis Arana
(74) *Attorney, Agent, or Firm*—Van Dyke, Gardner, Linn & Burkhart, LLP

(57) ABSTRACT

An improved transient interference detector and suppressor for an MRI system detects the presence of transient interference in an MRI signal by detecting the envelope of the MRI signal and comparing the rate of change of the envelope to a reference signal. When the rate of change of the envelope exceeds the reference signal, a transient interference detection is made and appropriate action may be taken. When the rate of change of the envelope is less than the reference signal, no transient interference detection is made. The reference signal is set at a level slightly above a level corresponding to the average thermal noise in order to substantially prevent the minor, random fluctuations in the thermal noise from falsely triggering the detection of a transient interference event.

36 Claims, 3 Drawing Sheets

MRI NOISE DETECTOR AND SUPPRESSOR

BACKGROUND OF THE INVENTION

This invention relates generally to magnetic resonance imaging equipment, and more particularly to a method for reducing transient noise that interferes with the desired signal and may decrease the quality of the image that is produced.

Magnetic resonance imaging, or "MRI," is an excellent medical diagnostic tool that has been around for several decades. The details of MRI are well-known and need not be repeated herein. In general, MRI involves placing a subject, such as a person, in a magnetic field of known strength. The hydrogen atoms in the subject, which are typically the atoms that are used for imaging in current MRI machines, will have a resonant frequency that is directly proportional to the applied magnetic field. By "shaping" the static magnetic field through the use of gradient coils, it is possible to produce a static magnetic field of known quantity at a single isolated region within the subject. This region is generally referred to as a voxel, and may be on the order of one cubic millimeter. By imaging thousands of these individual voxels, an overall image of the subject can be recreated.

The imaging of an individual voxel involves applying a radio frequency to the subject that corresponds to the resonant frequency of the voxel undergoing imaging. This resonant frequency is also known as the Larmor frequency. A certain number of hydrogen atoms in the voxel being imaged will absorb energy from the radio signal, which will cause them to switch spin states from a low energy state to a high energy state. After the radio signal is terminated, a certain number of hydrogen atoms in the high energy state will relax back to the low energy state, giving off a signal of known frequency during this relaxation process. By detecting this emitted signal, it is possible to determine the relative hydrogen content of the voxel being imaged. If the subject being imaged is a human, the different concentrations of hydrogen in the different human tissues will produce different signals for the voxels of different tissues. The different signals allow an image to be reconstructed such that it corresponds to the different tissues in the human body.

The signal emitted by the hydrogen atoms when relaxing from a high energy state to a low energy state is detected by a receiving antenna or coil that is positioned around the subject being imaged. In the case of MRI's designed for imaging humans, the receiving antenna or coil is generally cylindrically shaped with the person positioned in the center of the cylinder. The MRI machine may contain a number of different coils of different size, location, and configuration in order to image different parts of the human body. In addition to the signals emitted by the relaxing hydrogen atoms, the detector coils or antennas will sense additional noise or interference signals. These noise or interference signals are desirably removed from the detected signal in order to produce a better image.

One prior art method for reducing the noise or interference in the receiving antennas is disclosed in U.S. Pat. No. 5,525,906 issued to Crawford et al., the disclosure of which is hereby incorporated herein by reference. In this method, which is depicted in block diagram in FIG. 3 herein, the signal from the receiving antenna is split into a detect path signal 1020 and a receive path signal 1022. The detect path 1020 passes through a band pass filter 1024 which removes broad band thermal noise from the detect path signal 1020. The detect path signal 1020 then passes through an amplifier 1026 before being input into a notch or band reject filter 1028. Notch filter 1028 is designed to reject all frequencies that occur within the desired signal frequency range, which has a known bandwidth. The output 1030 of filter 1028 will thus consist of unfiltered noise. The unfiltered noise 1030 is input into a comparator 1032 which compares this signal to a voltage threshold 1034. If the unfiltered noise signal 1030 exceeds the voltage threshold 1034, comparator 1032 outputs a signal at 1036 that causes switch SW1 to open, thereby blanking the output 1038. If the unfiltered noise signal 1030 does not exceed the voltage threshold 1034, the comparator outputs signal 1036, which leaves switch SW1 closed such that the receive signal 1022 is passed through to output 1038, after passing through delay filter 1040. The purpose of delay filter 1040 is to delay the signal on the receive path 1022 from reaching switch SW1 prior to comparator output signal 1036 reaching switch SW1. Such a system is described in more detail in the U.S. Pat. No. 5,525,906, particularly in reference to FIGS. 3 and 4 in the corresponding disclosure therein. While this prior art method has been successful in producing images of higher clarity, the need still exists for improved imaging techniques.

SUMMARY OF THE INVENTION

Accordingly, the present invention provides an improved method and apparatus for increasing the quality of MRI images. The present invention achieves this improved quality by providing an improved method for detecting transient noise that is generated in the MRI system.

According to one embodiment of the present invention, a method is provided for detecting interference in an MRI signal received from an MRI receiving antenna. The method comprises detecting a parameter of the MRI signal that varies as the envelope of the MRI signal varies and filtering the MRI signal to thereby produce a filtered parameter signal. The filtered parameter signal is them compared to a reference signal. The MRI signal is determined to likely include interference if the filtered parameter signal exceeds the reference signal.

According to another aspect of the invention, a method is provided for detecting transient interference in an MRI signal that comprises detecting an envelope of the MRI signal and filtering out low frequency components of the MRI signal to thereby produce a filtered envelope signal. The filtered envelope signal is compared to a reference signal and it is determined that the MRI signal includes interference if the filtered envelope signal exceeds the reference signal.

According to still another aspect of the invention, an interference detection system is provided for detecting interference in an MRI signal received from an MRI receiving antenna. The system includes a filter designed to remove low frequency components within the MRI signal, and an envelope detector that detects the envelope of the MRI signal. The filter and envelope detector produce in combination a filtered envelope signal. A comparator compares the filtered envelope signal to a reference signal and outputs an interference signal if the filtered envelope signal exceeds the reference signal.

According to yet another aspect of the invention, an interference detection system is provided for detecting interference in an MRI signal received from an MRI receiving antenna. The system comprises a filter designed to remove low frequencies within the MRI signal and a detector that detects a parameter that varies as the envelope of the MRI signal varies. The filter and detector produce in combination a filtered parameter signal. A comparator compares the filtered parameter signal to a reference signal and outputs an interference signal if said filtered parameter exceeds the reference signal.

In still other aspects of the invention, the parameter detector and/or the envelope detector may comprises a detector log video amplifier. The system may include a blanking switch controlled in a manner to blank the MRI signal if the comparator outputs the interference signal. The system may further includes a retriggerable multivibrator that is activated by the interference signal.

The methods and systems of the present invention provide improved clarity in MRI images by more accurately discerning whether or not the signal in an MRI receiving coil is corrupted by transient noise. By more accurately determining whether transient interference is present, appropriate steps can be taken from preventing these transient interference signals from being used to produce image data. These and other advantages of the present invention will be apparent to one skilled in the art in light of the following specification when read in conjunction with the accompanying drawings.

DETAILED DESCRIPTION OF THE PREFERRED EMBODIMENTS

Figure 1:
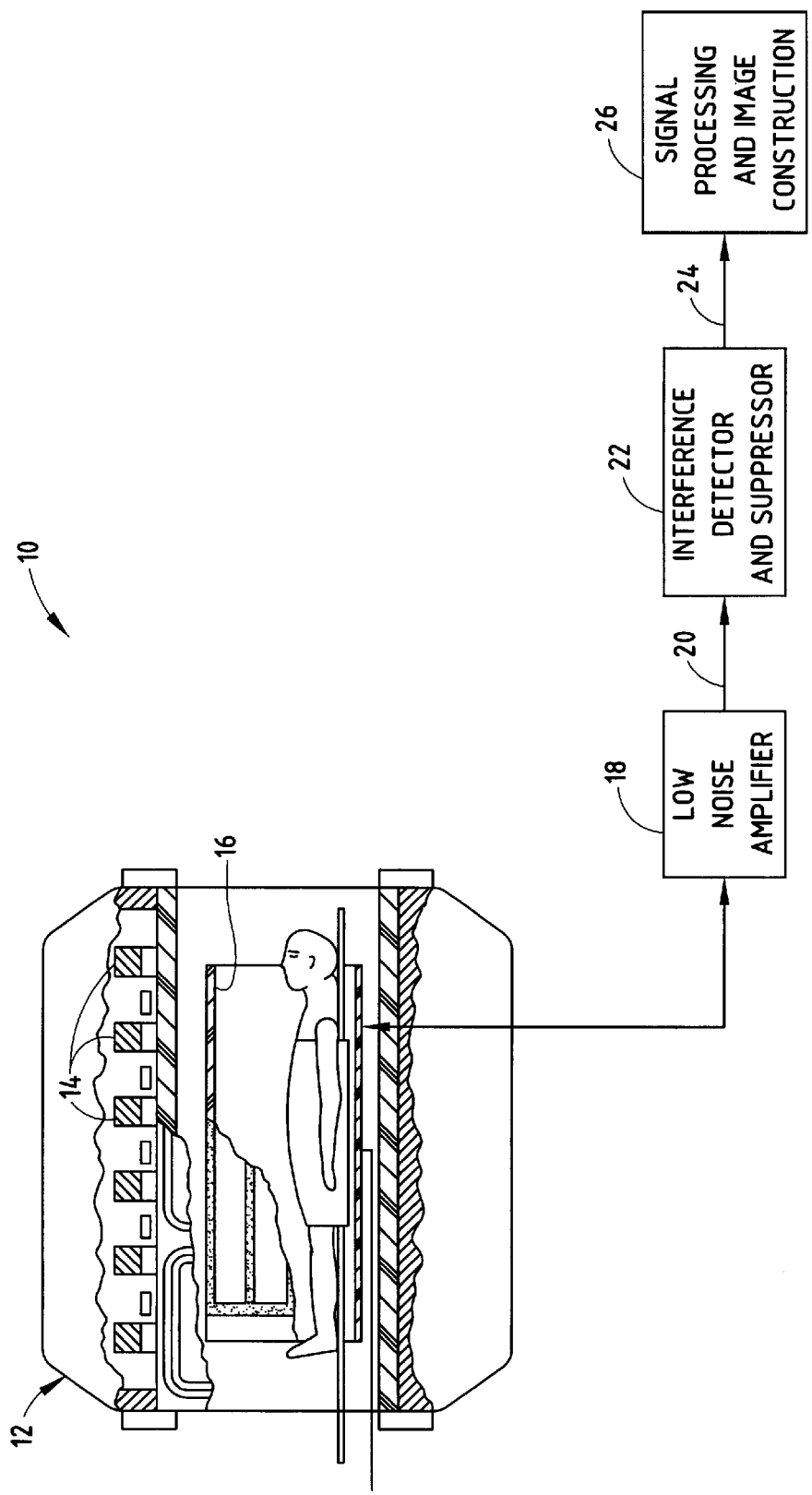
FIG. 1 is a block diagram of an MRI system according to one aspect of the invention.

The present invention will now be described with reference to the accompanying drawings wherein like reference numerals correspond to like elements in the several drawings. A block diagram of an MRI system 10 is depicted in FIG.1. MRI system 10 includes a magnet assembly 12, the details of which are not part of the present invention. As an illustrative example, magnet assembly 12 may include a polarizing magnet 14 and a radio frequency (RF) coil or antenna 16, both of which generally surround a patient being imaged. RF coil 16 may be used to both transmit RF signals and detect the MRI image signals, or separate coils may be used for transmission and detection. The MRI image signals that are detected by RF coil 16 are first typically passed to a low noise amplifier or pre-amplifier 18, which may have a gain of 30 dB and a noise figure of about ½ dB, although other values can be used. From amplifier 16, the signals are passed along line 20 to interference detector and suppressor 22, which is part of the present invention. After passing through interference detector 22, the signals are sent along a line 24 to a signal processing and image construction module 26, which may comprise a number of different components such as a down converter, computers, computer terminals, monitors, and memory devices. Signal processing and image construction module 26 forms no part of the present invention, and the details of one example of such a module can be found in U.S. Pat. No. 5,525,906, the disclosure of which is incorporated herein by reference.

Interference detector and suppressor 22 determines whether the MRI signals coming in on line 20 likely contain transient interference that would improperly be interpreted as image, or desired, signals. In general overview, interference detector and suppressor 22 operates by recognizing that the transient interference, such as sparks, will virtually always have an envelope that varies at a significantly greater rate than the other signals in the system. By detecting a high rate of envelope change in the incoming signals, interference detector and suppressor 22 determines that the incoming signal is likely corrupted with transient interference, and the appropriate action is taken.

The signals coming in on line 20 are made of three different types of signals: (1) the desired signals, which are used to generate images, (2) thermal noise, which is always present, and (3) transient interference, which occurs sporadically and usually is the result of sparks, or other temporary interference events. The desired signals have a known frequency range that is narrow with respect to the other two signals. The desired signals are centered around the Larmor frequency and may have a bandwidth of approximately two-hundred to four-hundred kilohertz. The thermal noise is present at all frequency levels but is limited in MRI system 10 by the bandwidths of receiving antenna 16 and low noise amplifier 18. Receiving antenna 16 and amplifier 18 are generally tuned to have a maximum gain over a relatively narrow bandwidth around the desired frequency range, while having substantial gain over a wider frequency range of several tens of megahertz (typically 40 MHz). The thermal noise therefore has a much wider bandwidth than the desired signals. The transient interference or noise spikes usually manifest themselves as impulse events, such as small sparks that are near enough to receiving antenna 16 to induce a voltage in antenna 16. As such, the noise spikes have a very broad frequency component.

The voltage induced in receiving antenna 16 by the sparks will be transferred to interference detector and suppressor 22 according to the impulse response of antenna 16 and amplifier 18. According to linear system theory, this impulse response may be described as a carrier frequency with an associated envelope wherein the envelope will have characteristics that are dominated by the bandwidth of antenna 16 and amplifier 18. Because antenna 16 and amplifier 18 have a much wider frequency response than the desired signal's bandwidth (typically by a factor of 100 to 1000), the envelope of the noise spike will exhibit a rate of change that is much faster than the envelope of the desired signal. The envelope of the noise spike will also change much faster than the envelope of the thermal noise, which remains nearly constant.

Figure 2:
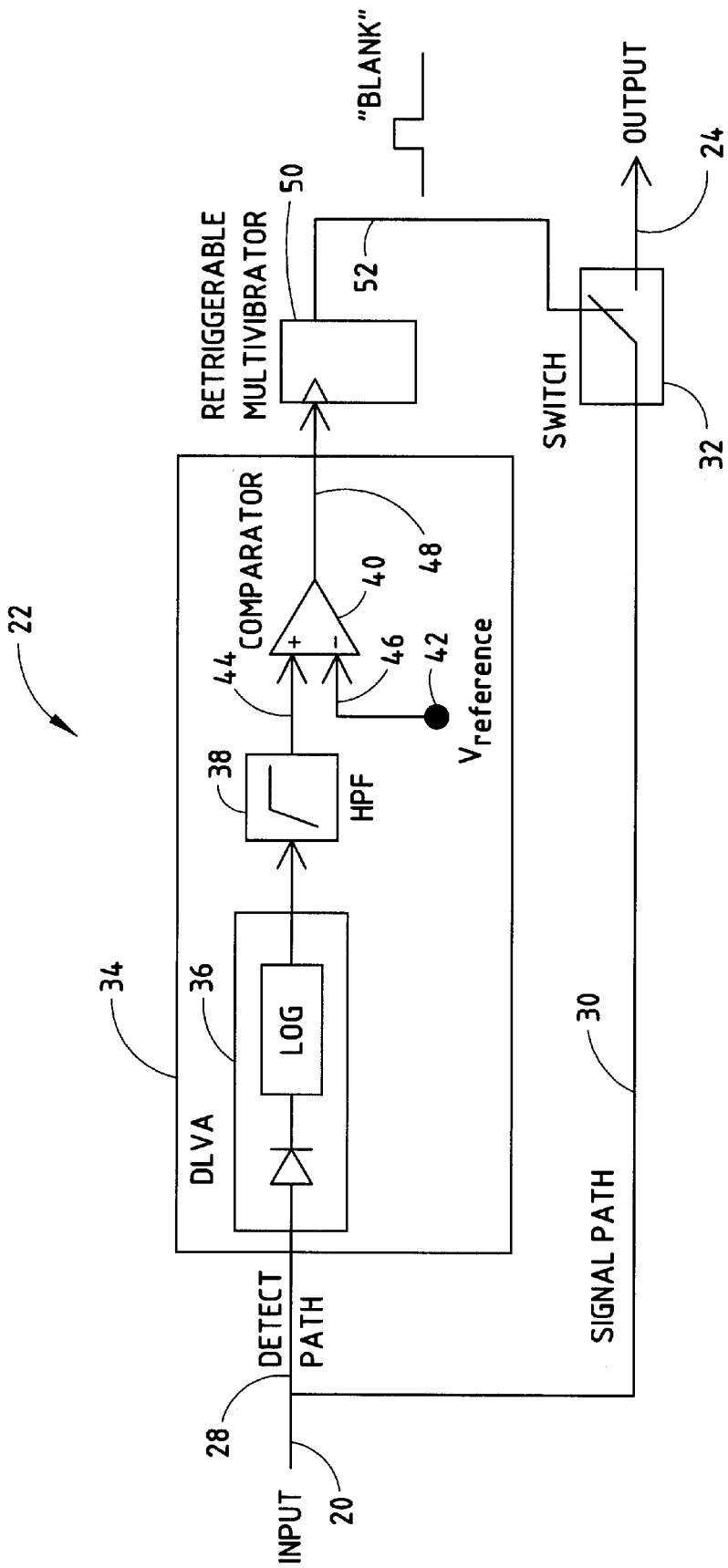
FIG. 2 is block diagram of one embodiment of the interference detector and suppressor of FIG. 1.
Figure 3:
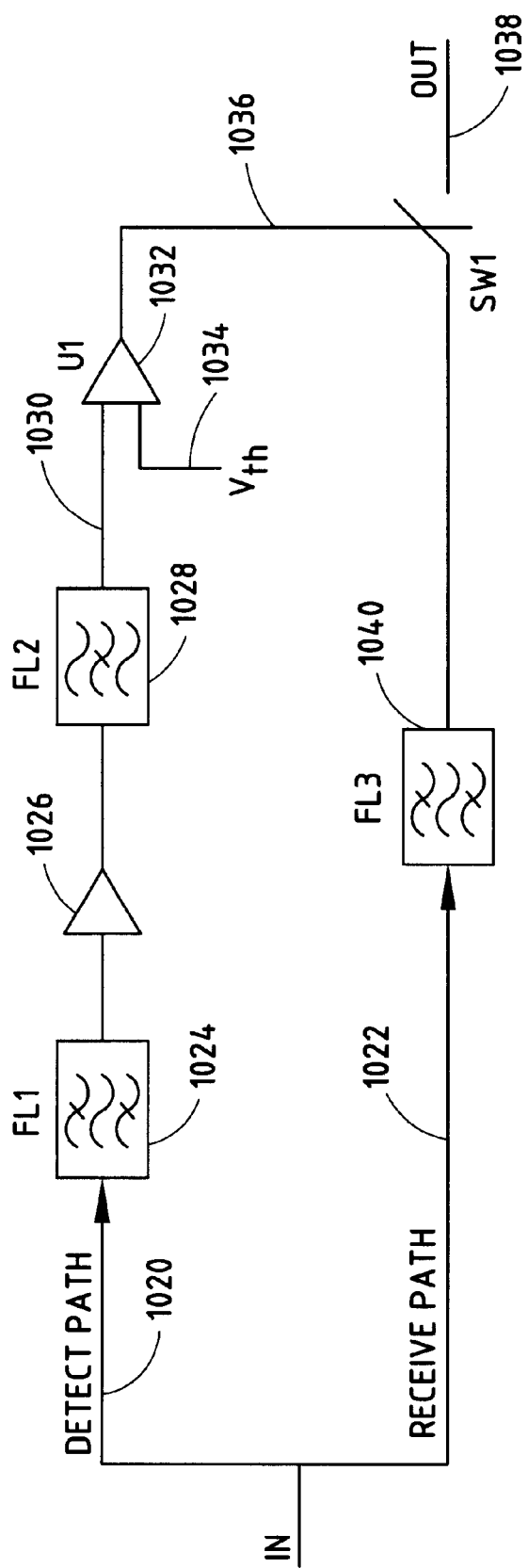
FIG. 3 is a block diagram of a prior art interference detector and suppressor.

The detailed operation of interference detector and suppressor 22 is best explained with reference to FIG. 2. Interference detector and suppressor 22 has line 20 as its input, which is split between a detect path 28 and a signal path 30. Signal path 30 is fed into a switch 32 which allows signal path 30 to be directly coupled to output 24 when switch 32 is closed. In this embodiment, switch 32 is closed when no interference is detected, and opened when interference is detected. The opening of switch 32 is referred to as blanking as it prevents the MRI signal on signal path 30 from being fed into signal processing and image construction module 26. Switch 32 is controlled by an interference detector 34 placed along detect path 28. Interference detector 34, in the illustrated embodiment, includes a detector log video amplifier (DLVA) 36, a high pass filter 38, and a comparator 40. In the current embodiment, DLVA 36 is a 0.1 GHz to 2.5 GHz, 70 dB Logarithmic Detector/Controller model AD8313 sold by Analog Devices, Inc. which has a place of business in Norwood, Mass. Other detector log video amplifiers can, of course, be used within the scope of the invention. The details of the model AD8313 can be found in the accompanying technical data sheet (revision B) published by Analog Devices, Inc., and downloadable from the web site http://www.analog.com the disclosure of which is hereby incorporated herein by reference. Although other high pass filters may be used, high pass filter 38 is a 500 KHz, three pole filter in the current embodiment. Comparator 40 may be any circuit that produces an output based upon the comparison of two inputs.

Detector log video amplifier 36 provides an output to high pass filter 38 that has a voltage corresponding to the power of the signal on detect path 28 that is input into DLVA 36. For example, if the model AD8313 is used for DLVA 36, it will output a voltage of approximately 0.6 volts, 0.8 volts, 1 volt, and 1.2 volts for input powers of −60 dBm, −50 dBm, −40 dBm, and −30 dBm, respectively (at approximately 900 MHz). The power of the input to DLVA 36 is a parameter that varies as the envelope of the input to DLVA 36 varies. Measuring changes in the power of the input to DLVA 36 therefore allows for changes in the envelope of the input to DLVA 36 to be detected. It will be understood by those skilled in the art that other devices could be used to detect the power of the incoming signal on detect path 28, and that instead of measuring power, the envelope could be directly detected, or that other parameters that vary as the envelope varies could alternatively be detected. Because the envelope of interfering noise spikes will change at a much greater rate than the desired signals or the thermal noise, the output of DLVA 36 will vary greatly only when an interfering noise spike is present. High pass filter 38 distinguishes between the interfering noise spike and the desired signals and thermal noise by substantially filtering out the low frequency components of the output of DLVA 36 that are due to the desired signals and the thermal noise.

The output of high pass filter 38 is fed into a first input 44 of comparator 40 which compares its value to the value of a reference voltage 42 that is fed into a second input 46 of comparator 40. If the value of first input 44 exceeds the value of second input 46, comparator 40 outputs a high signal (an interference signal) at its output 48. The output 48 of comparator 40 is optionally, though preferably, fed into a retriggerable multivibrator 50 which outputs a high signal (or blank signal) at 52 for a predetermined time period when its input receives a high signal. The purpose of multivibrator 50 is to provide a uniform blanking period when interference is detected by detector 34. While the duration of the blanking signal output from multivibrator 50 can be varied as desired, the duration of the blanking signal is preferably equal to the sampling rate of an analog-to-digital (A/D) converter (not shown) that converts the analog signal on path 30 to a digital signal. This A/D converter is located in signal processing and image construction module 26, and preferably converts the analog signal on path 30 to digital after the analog signal has been down-converted to lower frequencies. In the current embodiment, this sampling period is five microseconds, and multivibrator 50 outputs a five microsecond pulse every time its input goes high to thereby assure that the MRI signal on path 30 will be blanked for five microsecond increments.

Reference voltage 42 is preferably set at a value that is 6 to 10 dB above the thermal noise floor, although other values ranging from 2 to 20 dB and beyond can be used within the scope of the invention. In order to set reference voltage 42 a desired amount above the thermal noise floor, it is necessary to know the slope of the input/output characteristics of DLVA 36. For example, if DLVA 36 has a 20 millivolt output for every one dBm of input power, then reference voltage 42 should be set at 120 millivolts (6 dBm×20 mV/dBm) to be 6 dB above the thermal noise floor. If it were desired to set reference voltage 42 at 10 dB above the thermal noise floor, it should be set at a value of 200 millivolts (10 dBm×20 mV/dBm). Setting the value of reference voltage 42 is therefore dependent only upon the slope of the input/output characteristics of DLVA 36 and the desired level above the thermal noise floor. This provides the advantage that detector 34 does not need to be re-adjusted or replaced when it is used in different temperature environments, or even when it is used with different antennas 16 that may have different thermal noise characteristics. While changing antennas or the temperature may cause a change in the average power of the thermal noise, these changes will be relatively slowly varying. As such, they will be filtered out by high pass filter 38. For example, suppose the thermal noise floor initially presents −50 dBm of power to the input of DLVA 36, causing DLVA 36 to output a signal of 0.8 volts. The 0.8 volt output of DLVA 36 will be generally constant (i.e. slowly changing) and therefore filtered out by high pass filter 38. The same is true if the thermal noise floor changes to a power of −40 dBm, causing a change in the output of DLVA 36 from 0.8 to 1 volt, or some other value. Because this change is slow with respect to the envelope changes of the interference signal, it will be filtered out by high pass filter 38. Detector 36 therefore provides the advantage that reference voltage 42 need not be changed once it is set, despite changes to the thermal noise brought about by changing temperatures or changing antennas.

Various modifications can be made to the embodiment described above without departing from the scope of the invention. One such change is reversing the order of high pass filter 38 and detector log video amplifier 36 such that detect path 28 is first fed into high pass filter 38 whose output is then fed into DLVA 36. Another change is the addition of a delay filter in signal path 30 to create a delay in signal path 30 equal to the delay of detect path 28. Another change is to use comparator output 48 to trigger corrective action other than blanking, such as, for example, re-scanning of the area corresponding to the corrupted signal. As still another change, a low pass filter might be inserted between the output of DLVA 36 and the input to high pass filter 38. Such a low pass filter might be a single pole filter with a cut-off frequency of around ten megahertz. The low pass filter would help avoid false blanking due to random fluctuations in the thermal noise floor by filtering out any such high frequency random fluctuations. Further possible modifications include the use of a bandpass filter for filtering the input 20 into noise detector and suppressor 22. Such a filter may be used to reduce thermal noise and remove inconsequential frequencies that are widely offset in frequency from the desired signals. A different type of envelope detector other than DLVA 36 may also be used.

While the present invention has been described in terms of the preferred embodiments depicted in the drawings and discussed in the above specification, along with several alternative embodiments, it will be understood by one skilled in the art that the present invention is not limited to these particular embodiments, but includes any and all such modifications that are within the spirit and the scope of the present invention as defined in the appended claims.

What is claimed is:

1. A method of detecting transient interference in an MRI signal received from an MRI receiving antenna comprising:
   detecting a parameter of the MRI signal that varies as the envelope of the MRI signal varies and filtering out low frequency components of said MRI signal to thereby produce a filtered parameter signal;
   comparing said filtered parameter signal to a reference signal; and determining that said MRI signal likely includes interference if said filtered parameter signal exceeds said reference signal.

2. The method of claim 1 wherein said parameter of said MRI signal is the power of said MRI signal.

3. The method of claim 1 wherein said parameter of said MRI signal is the envelope of said MRI signal.

4. The method of claim 2 further including outputting an interference detection signal for a period of time greater than the amount of time said filtered parameter signal exceeds said reference signal if said MRI signal likely includes interference.

5. The method of claim 2 further including blanking said MRI signal if said filtered parameter signal exceeds said reference signal, and not blanking said MRI signal if said filtered parameter signal does not exceed said reference signal.

6. The method of claim 2 wherein the detecting of the envelope is carried out by a detector log video amplifier.

7. A method for detecting transient interference in an MRI signal received from an MRI receiving antenna comprising:
    detecting an envelope of said MRI signal and filtering out low frequency components of said MRI signal to thereby produce a filtered envelope signal;
    comparing said filtered envelope signal to a reference signal; and
    determining that said MRI signal likely includes interference if said filtered envelope signal exceeds said reference signal.

8. The method of claim 7 further including outputting an interference detection signal when said filtered envelope signal exceeds said reference signal.

9. The method of claim 8 further including outputting said interference detection signal for a period of time greater than the amount of time said filtered envelope signal exceeds said reference signal.

10. The method of claim 7 further including blanking said MRI signal if said filtered envelope signal exceeds said reference signal, and not blanking said MRI signal if said filtered envelope signal does not exceed said reference signal.

11. The method of claim 7 further including generating a re-scan signal if said filtered envelope signal exceeds said reference signal.

12. The method of claim 7 wherein said detecting of said envelope occurs prior to said filtering out low frequency components of said MRI signal.

13. The method of claim 7 wherein the detecting of the envelope is carried out by a detector log video amplifier.

14. The method of claim 13 further including setting said reference signal at a voltage equal to a change in output voltage of the detector log video amplifier when the detector log video amplifier's input changes by an amount within the range of 2–20 dB.

15. The method of claim 7 wherein said filtering of said MRI signal comprises filtering out substantially all frequencies below 500 kilohertz.

16. The method of claim 7 further including filtering out high frequency thermal noise components of said filtered envelope signal prior to comparing it to said reference signal.

17. The method of claim 16 wherein filtering out said high frequency thermal noise components comprises filtering out substantially all signals above ten megahertz.

18. An interference detection system for detecting interference in an MRI signal received from an MRI receiving antenna comprising:
    a filter designed to remove low frequencies within said MRI signal;
    an envelope detector that detects the envelope of said MRI signal, said filter and said envelope detector producing in combination a filtered envelope signal; and
    a comparator that compares said filtered envelope signal to a reference signal and outputs an interference signal if said filtered envelope signal exceeds said reference signal.

19. The system of claim 18 further including a pulse stretcher that stretches said interference signal for a predetermined amount of time.

20. The system of claim 19 wherein said pulse stretcher comprises a retriggerable multivibrator.

21. The system of claim 18 wherein said envelope detector comprises a detector log video amplifier.

22. The system of claim 18 further including a blanking switch controlled to blank said MRI signal if said comparator outputs said interference signal.

23. The system of claim 21 wherein said reference signal is set at a voltage equal to a change in output voltage of the detector log video amplifier when the detector log video amplifier's input changes by an amount within the range of 2–20 dB.

24. The system of claim 21 further including a blanking switch controlled to blank said MRI signal if said comparator outputs said interference signal.

25. The system of claim 18 wherein said filter filters out said low frequency components after said envelope detector has detected said envelope of said MRI signal.

26. The system of claim 18 wherein said filter is substantially a three pole, 500 kilohertz high pass filter.

27. The system of claim 26 further including a low pass filter coupled between said envelope detector and said comparator.

28. The system of claim 27 wherein said low pass filter is substantially a single pole, ten megahertz low pass filter.

29. A interference detection system for detecting interference in an MRI signal received from an MRI receiving antenna comprising:
    a filter designed to remove low frequencies within said MRI signal;
    an detector that detects a parameter that varies as the envelope of said MRI varies, said filter and said detector producing in combination a filtered parameter signal; and
    a comparator that compares said filtered parameter signal to a reference signal and outputs an interference signal if said filtered parameter signal exceeds said reference signal.

30. The system of claim 29 wherein said parameter is the power of said MRI signal.

31. The system of claim 30 wherein said detector comprises a detector log video amplifier.

32. The system of claim 30 further including a blanking switch controlled to blank said MRI signal if said comparator outputs said interference signal.

33. The system of claim 30 further including a retriggerable multivibrator that is activated by said interference signal.

34. The system of claim 31 wherein said reference signal is set at a voltage equal to a change in output voltage of the detector log video amplifier when the detector log video amplifier's input changes by an amount within the range of 2–20 dB.

35. An interference detection system for detecting interference in an MRI signal received from an MRI receiving antenna comprising:
- a detector log video amplifier;
- a high pass filter; and
- a comparator that compares the MRI signal after the MRI signal has passed through said detector log video amplifier and said high pass filter to a reference voltage, said comparator outputting an interference signal if said reference voltage is exceeded.

36. The system of claim 35 wherein said interference signal is coupled to a switch that blanks said MRI signal when said interference signal is output from said comparator.

* * * * *